(12) United States Patent
Park

(10) Patent No.: US 7,610,569 B2
(45) Date of Patent: Oct. 27, 2009

(54) CHIP DESIGN VERIFICATION APPARATUS AND DATA COMMUNICATION METHOD FOR THE SAME

(75) Inventor: Hyun-Ju Park, Seoul (KR)

(73) Assignee: Dong-Goo Yun (KR)

( * ) Notice: Subject to any disclaimer, the term of this patent is extended or adjusted under 35 U.S.C. 154(b) by 159 days.

(21) Appl. No.: 10/589,595

(22) PCT Filed: Feb. 17, 2005

(86) PCT No.: PCT/KR2005/000444

§ 371 (c)(1),
(2), (4) Date: Aug. 15, 2006

(87) PCT Pub. No.: WO2005/078583

PCT Pub. Date: Aug. 25, 2005

(65) Prior Publication Data

US 2007/0180413 A1 Aug. 2, 2007

(30) Foreign Application Priority Data

Feb. 17, 2004 (KR) .................. 10-2004-0010490

(51) Int. Cl.
G06F 17/50 (2006.01)
G06F 9/45 (2006.01)
G06F 9/455 (2006.01)

(52) U.S. Cl. .................. 716/5; 716/1; 716/4; 716/18; 703/20; 703/22; 703/23

(58) Field of Classification Search .............. 716/1, 716/4, 18; 703/20, 22, 23, 27; 717/136, 717/138

See application file for complete search history.

(56) References Cited

U.S. PATENT DOCUMENTS

| 5,841,967 A | 11/1998 | Sample et al. | ......... 395/183.09 |
| 6,058,492 A | 5/2000 | Sample et al. | ................ 714/33 |
| 6,356,862 B2 | 3/2002 | Bailey | ........................ 703/16 |

(Continued)

FOREIGN PATENT DOCUMENTS

JP 2000-215226 8/2000

(Continued)

OTHER PUBLICATIONS

PCT International Search Report; PCT/KR2005/000444; Dated: Jun. 22, 2005.

(Continued)

*Primary Examiner*—Helen Rossoshek
(74) *Attorney, Agent, or Firm*—Cantor Colburn LLP

(57) ABSTRACT

A method of verifying a chip design includes: a software side operation step of transmitting output data generated by an operation of a software block to an interface unit, determining whether output data of a hardware block received via the interface unit is valid by executing a chip design verification program, and applying only valid output data of the hardware block to the software block; and a hardware side operation step of transmitting output data generated by an operation of the hardware block to the software block, determining whether the output data of the software block received is valid by executing the chip design verification program in the interface unit, and applying only valid output data of the software block to the hardware block.

38 Claims, 11 Drawing Sheets

U.S. PATENT DOCUMENTS

| | | | |
|---|---|---|---|
| 6,618,839 B1 * | 9/2003 | Beardslee et al. | 716/4 |
| 6,823,497 B2 * | 11/2004 | Schubert et al. | 716/4 |
| 7,024,660 B2 * | 4/2006 | Andrade et al. | 717/124 |
| 7,107,202 B1 * | 9/2006 | Hegde et al. | 703/22 |
| 7,110,935 B1 * | 9/2006 | Hwang et al. | 703/20 |
| 7,185,295 B2 * | 2/2007 | Park et al. | 716/4 |
| 7,210,116 B2 * | 4/2007 | Zeidman et al. | 716/18 |
| 7,240,303 B1 * | 7/2007 | Schubert et al. | 716/4 |
| 7,340,693 B2 * | 3/2008 | Martin et al. | 716/1 |
| 7,353,162 B2 * | 4/2008 | Huang et al. | 703/23 |
| 7,366,651 B1 * | 4/2008 | Milne et al. | 703/27 |
| 7,370,311 B1 * | 5/2008 | Pritchard et al. | 716/18 |
| 7,373,638 B1 * | 5/2008 | Schliebusch et al. | 717/136 |
| 7,376,939 B1 * | 5/2008 | Nayak et al. | 717/144 |
| 2002/0059054 A1 * | 5/2002 | Bade et al. | 703/20 |
| 2003/0074153 A1 | 4/2003 | Sugamori et al. | 702/122 |
| 2007/0113209 A1 * | 5/2007 | Park et al. | 716/4 |

FOREIGN PATENT DOCUMENTS

| | | |
|---|---|---|
| JP | 2003-330992 | 11/2003 |
| JP | 2003-536083 | 12/2003 |

OTHER PUBLICATIONS

Written Opinion of the International Searching Authority of corresponding PCT application: PCT/KR2005/000444; Date: Jun. 22, 2005.

* cited by examiner

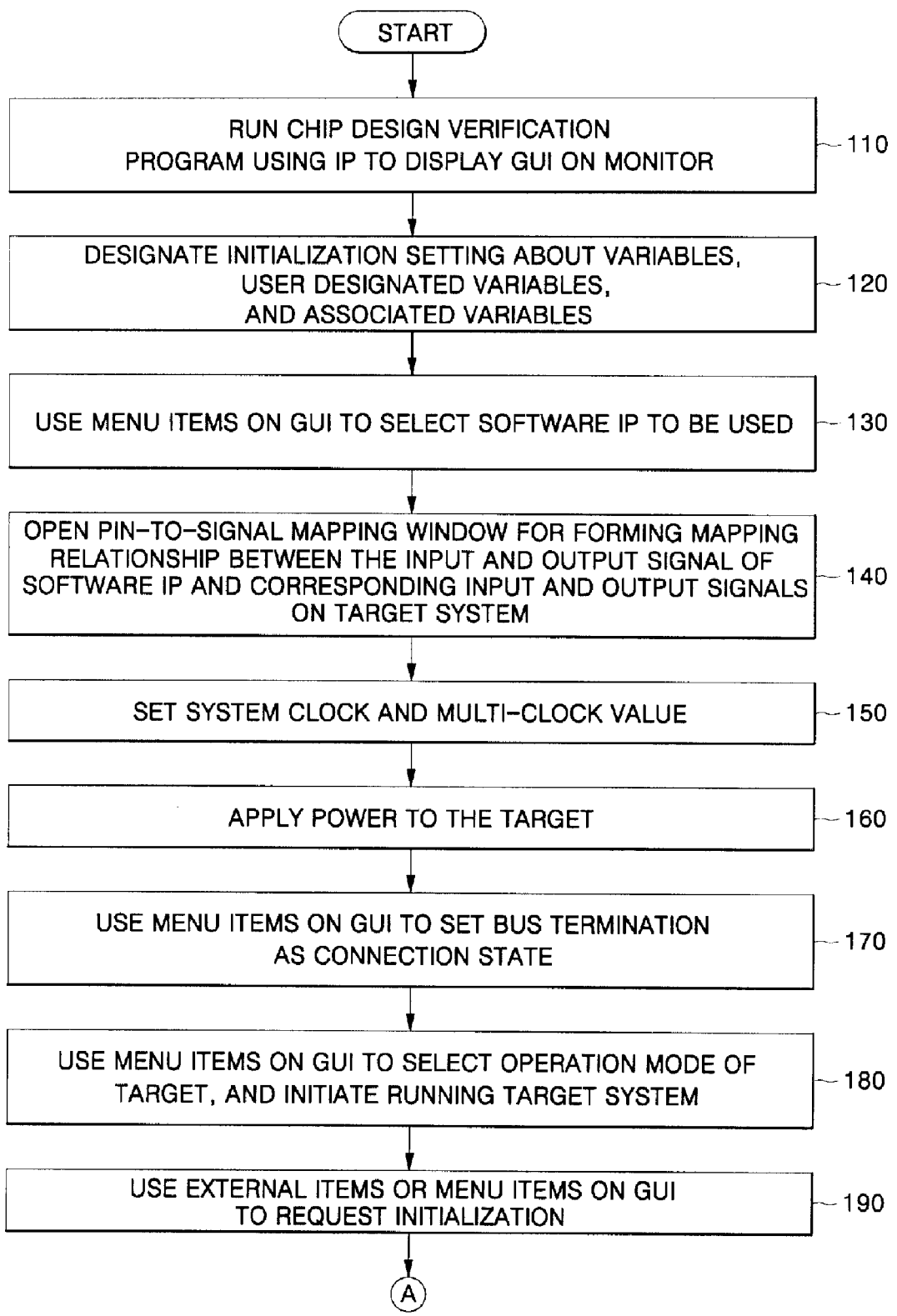

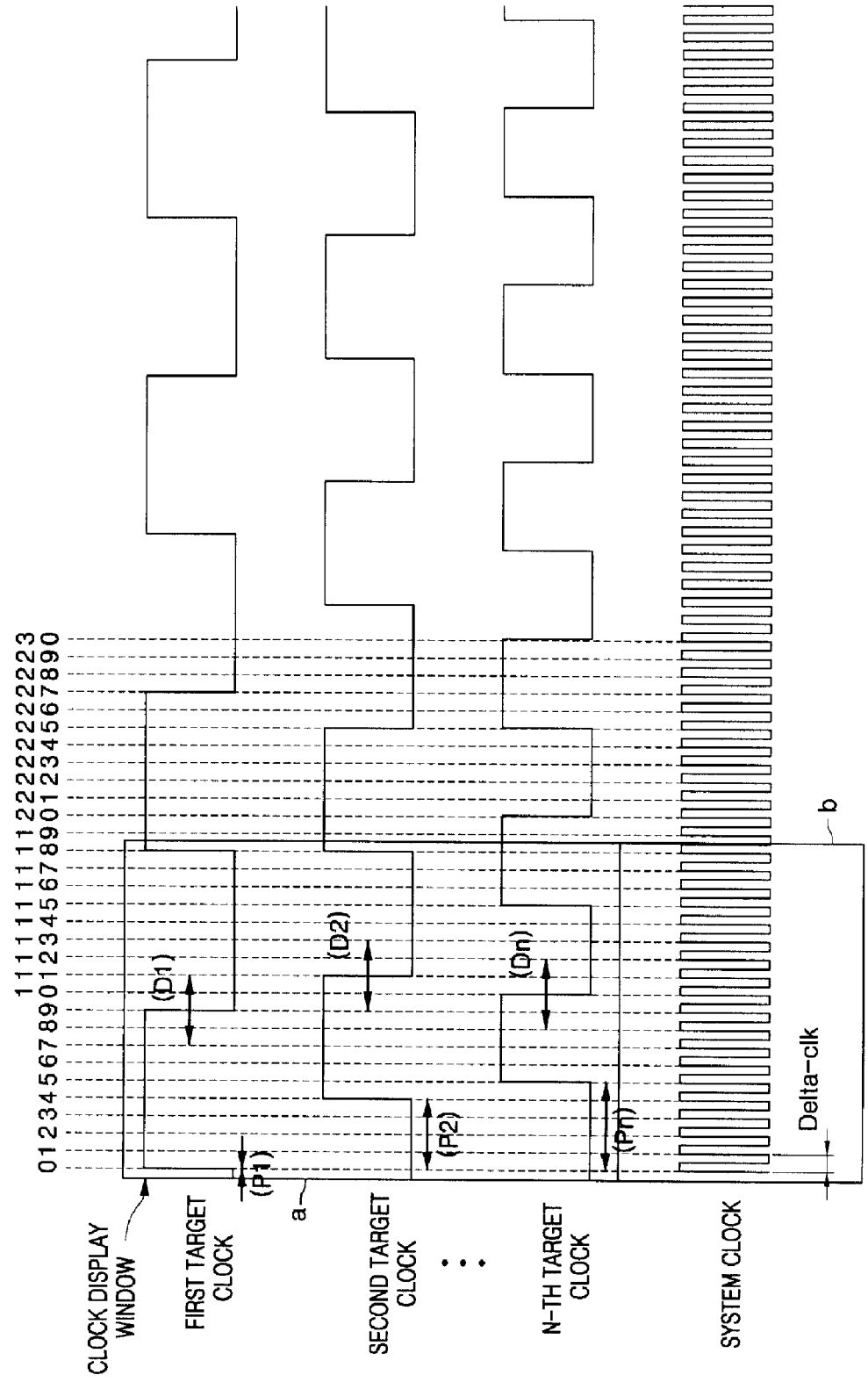

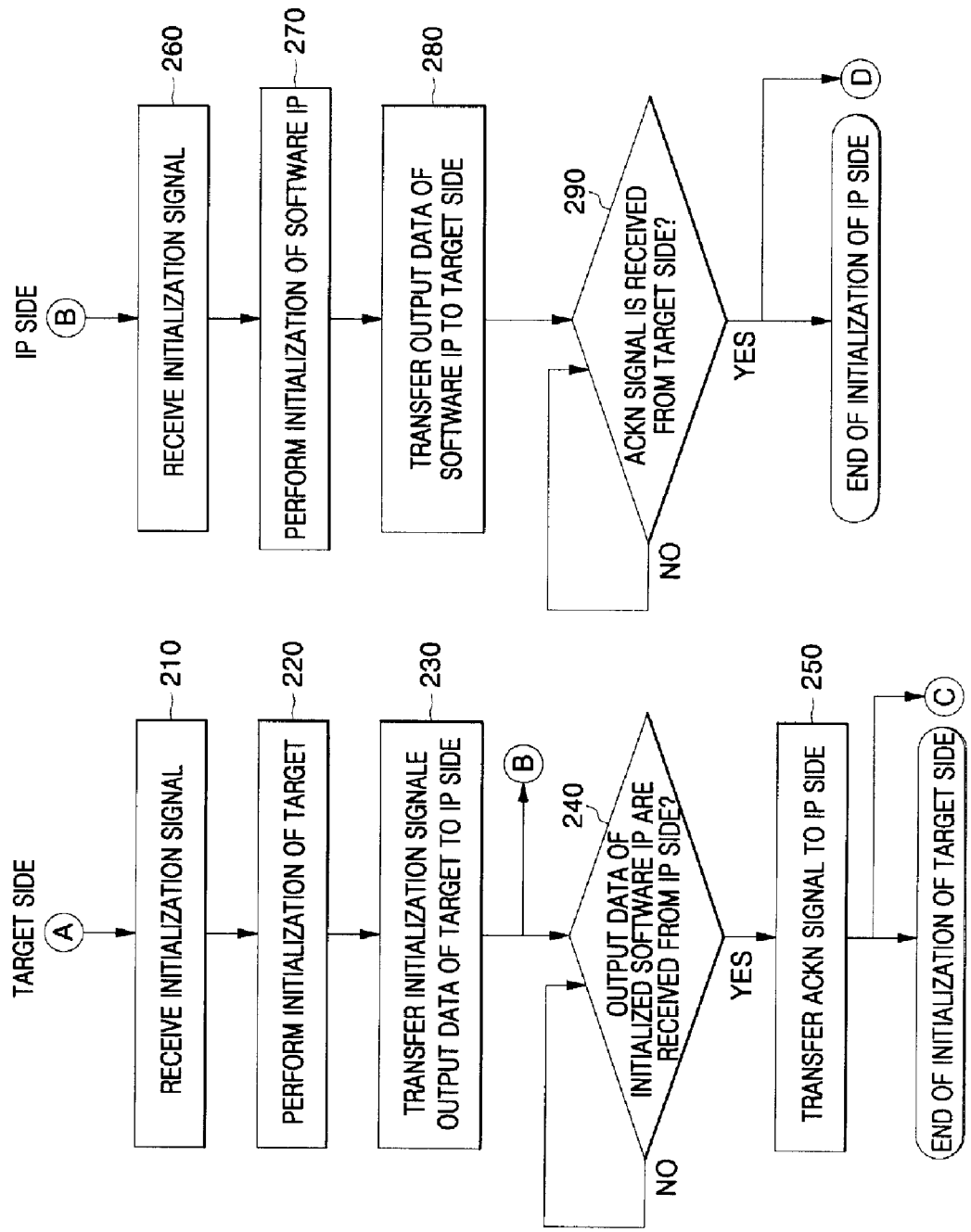

CHIP DESIGN VERIFICATION APPARATUS AND DATA COMMUNICATION METHOD FOR THE SAME

TECHNICAL FIELD

The present invention is related to a chip design verification apparatus, and in particular to a chip design verification apparatus and a data communication method utilizing a software intellectual property (IP).

BACKGROUND ART

Various electronic design automation (EDA) associated with semiconductor design automation are increasingly supplied and design methods using hardware description language (HDL) become universal in nowadays, which has significantly improved the design environment of application specific integrated circuit (ASIC).

The size of the circuit to be designed has thus reached the level of designing a capacity in a range of several millions to tens of millions of gates in recent years from the conventional level of tens of thousands to hundreds of thousands, so that the ASIC may be implemented on one chip. A system having the above-described configuration is referred to as a System-on-a-chip (SoC).

In addition, when the ASIC or the SoC is designed, it is more general that some function blocks of an existing design may be modified or added rather than that a zero-based design for the whole part is developed, and the function blocks to be modified or added are also utilized such that intellectual property (IP) blocks present on a unit function block basis are utilized, which may be regarded as the general tendency of the ASIC or the SoC design in the recent years.

The IPs which provide such various applications and are provided as pre-designed models may be broadly classified as software IP and hardware IP.

The software IP is implemented as a language such as C, C++, system C, HDL, VERILOG® HDL (VHDL), etc. depending on a coding format of a source code, and the hardware IP is implemented as an ASIC, a Field Programmable Gate Array (FPGA), or a board, etc. which has mounted various devices including the same.

DISCLOSURE

Technical Problem

However, when the IP is traded or released on a hardware basis, there exist several troubles as follows.

First, when the hard IP to be delivered as a sample type is ball grade array (BGA), ASIC, or FPGA having a plurality of pins, a new board must be manufactured so as to have the hardware IP mounted thereon, and poor IP operations may often occur in response to the assembled state after the board is manufactured.

Second, when the hardware IP is the FPGA type, a separate programmable read only memory (PROM) must be delivered together in the FPGA used in a static random access memory (SRAM) manner, which may cause the PROM to be copied for the fraud.

Third, the hardware IP is physically implemented, which inevitably causes a time delay in response to the sample delivery.

Alternatively, when the IP is traded or released on a software model basis, the above-described problems do not occur. That is, the IP reliability may be guaranteed, the security vulnerableness resulted from delivery is not exposed, and the time delay resulted from the delivery does not occur when the software IP is employed, whereas it has significantly lower speed than the hardware IP at the time of usage.

In particular, the present invention is related to a chip design verification apparatus and a data communication method for the same which utilizes the software IP providing its own advantages while minimizing the drawbacks of the hardware IP, and a chip design verification apparatus and a data communication method for the same which may accelerate the high speed simulation corresponding to the ASIC design capacity of SoC class in a range from several millions to tens of million of gates.

The design verification implies a test for an accepted entity, which means that the design is tested based on the specification for the chip design, and the purpose of verifying the chip design is to find out whether the design is implemented within the entity limit and properly operates as intended after its fabrication.

Accordingly, in order to implement the purpose of verifying the design for chip, co-simulation of the hardware design block of the chip, that is, the target and the software block constituted by software IP and/or test-bench must be carried out.

A conventional chip design verification apparatus for accelerating the simulation or a chip design verification apparatus using the software IP is disclosed in U.S. Pat. No. 6,356,862 which has described the hardware and software co-verification means employing deferred synchronization. The apparatus disclosed in the U.S. Pat. No. 6,356,862 has a co-verification coordinator for hardware and software which may perform the verification in a synchronization state between with the software verification means and the hardware verification means.

This apparatus uses a synchronization window for allowing the mutual synchronization between the hardware verification means and the software verification means to be implemented, and the size of the synchronization window is determined by the verification means which operates slower in regards to the verification means operating faster.

As a result, the operation standby time is increased, which causes the whole speed for verifying the chip design to be lowered.

In addition, the software IP, test patterns required for verifying the chip design of the target, and the test-bench for providing the clock pattern having multi clocks are present within a computing system, and the target is present outside the system, so that the software IP and the target perform data communication via separate interface means.

As a result, when the co-simulation for hardware and software are carried out to verify the chip design, speed and efficiency of data communication between the software IP and the target become essential factors in determining the overall performance.

However, in the case of the conventional chip design verification apparatus, output data generated at one party between the software IP and the target were provided to the other party based on a constant period of each clock signal output from the test-bench. This in turn caused the amount of data communication to be unnecessarily increased.

In addition, in the case of the conventional chip design verification apparatus, the target had to be provided with clocks (in general, multi clocks) necessary for its operation from the test-bench present within the computing system.

As a result, data transfer delay has inevitably occurred when changes of each clock output from the test-bench were transferred to the interface means, which caused the operating speed of the target for chip design verification to be unnecessarily lowered.

Technical Solution

It is thus a purpose of the present invention to provide a chip design verification apparatus and a data communication method for the same, which may assist mutual connection between the software IP and the target to verify errors and faults of the chip design in the chip design stage.

It is another purpose of the present invention to provide a chip design verification apparatus and a data communication method for the same for IP verification and/or simulation acceleration which allows data to be transceived between the target and the software block constituted by the test-bench and/or the software IP based on events to be carried out to enhance the data transfer speed and the efficiency.

It is still another purpose of the present invention to provide a chip design verification apparatus and a method for the same which allows multi clocks for the target operation to be independently generated in the interface means to increase the operation speed of the target.

The chip design verification apparatus for achieving the above-described purposes is characterized in that it includes: at least one hardware block; and a computer including at least one software block of performing data communication with the hardware block, and verifying an operation between the hardware block and the software block, the computer including an interface means of transmitting output data of the hardware block, determining whether the output data of the software block is valid, and applying only the valid output data of the software block to the hardware block; a storage means of storing a software block and a chip design verification program for verifying the software block; and a controller of transmitting the output data of the software block generated by the operation of executing the chip design verification program to the interface means, determining whether the output data of the hardware block input via the interface means is valid, and applying only the valid output data of the hardware block to the software block.

The chip design verification apparatus according to the first aspect of the present invention for achieving the above-described purposes is characterized in that it includes a software side operation step of transmitting output data generated by the operation of the software block to the interface means, determining whether the output data of the hardware block received via the interface means is valid by executing the chip design verification program, and applying only the valid output data of the hardware block to the software block; and a hardware side operation step of transmitting output data generated by the operation of the hardware block to the software block, determining whether the output data of the software block received is valid by executing the chip design verification program in the interface means, and applying only the valid output data of the software block to the hardware block.

The chip design verification apparatus according to the second aspect of the present invention for achieving the above-described purposes is characterized in that the method includes: a clock generation step of allowing the chip design verification program to obtain a multi clock setting value to be provided to the interface means, and generate multi clocks in response to a system clock of the chip design verification program and the multi clock setting value to be applied to the software block, and allowing the interface means to generate multi clocks in response to the system clock of the interface means and the multi clock setting value to be applied to the hardware block; a software side operation step of transmitting output data generated by the operation of the software block operating in response to the multi clocks of the chip design verification program to the interface means, determining whether the output data of the hardware block received via the interface means is valid by executing the chip design verification program, and applying only the valid output data of the hardware block to the software block; and a hardware side operation step of transmitting output data generated by the operation of the hardware block operating in response to the multi clocks of the interface means to the software block, determining whether the output data of the software block received is valid by executing the chip design verification program in the interface means, and applying only the valid output data of the software block to the hardware block.

ADVANTAGEOUS EFFECTS

According to the chip design verification apparatus and the data communication method for the same of the present invention, the chip design is provided with an accuracy allowing the errors and the faults of the chip design to be verified in the chip design stage by means of a chip design verification program and an interface means, and time and cost required for the chip design are reduced.

In addition, according to the chip design verification apparatus and the method for the same of the present invention, data communication are performed only when changes of the software IP or the target occur, that is, only when the event occurs, so that data transfer speed and efficiency are enhanced.

In addition, according to the chip design verification apparatus and the method for the same of the present invention, changed output data of the software IP or the target are extracted and compressed at the time of data transmission, which are transferred to the other party so that data transfer speed and efficiency are enhanced.

In addition, according to the chip design verification apparatus and the method for the same of the present invention, the interface means may generate multi clocks for independently operating the target to be directly applied, so that the delay caused by the multi clocks supplied from the computing system may be remarkably reduced. Accordingly, a faster chip design verification speed may be assisted.

DESCRIPTION OF DRAWINGS

FIG. 6 is a flow chart for explaining operations within a computing system performed according to a chip design verification method of the present invention.

FIGS. 7A and 7B are flow charts for explaining a procedure of generating multi clocks and a reference clock of FIG. 6 in detail.

FIG. 8 is a flow chart for explaining an initialization operation performed according to a chip design verification method of the present invention.

BEST MODE

Hereinafter, a chip design verification apparatus and a data communication method for the same will be described in detail with reference to accompanying drawings.

Figure 1:
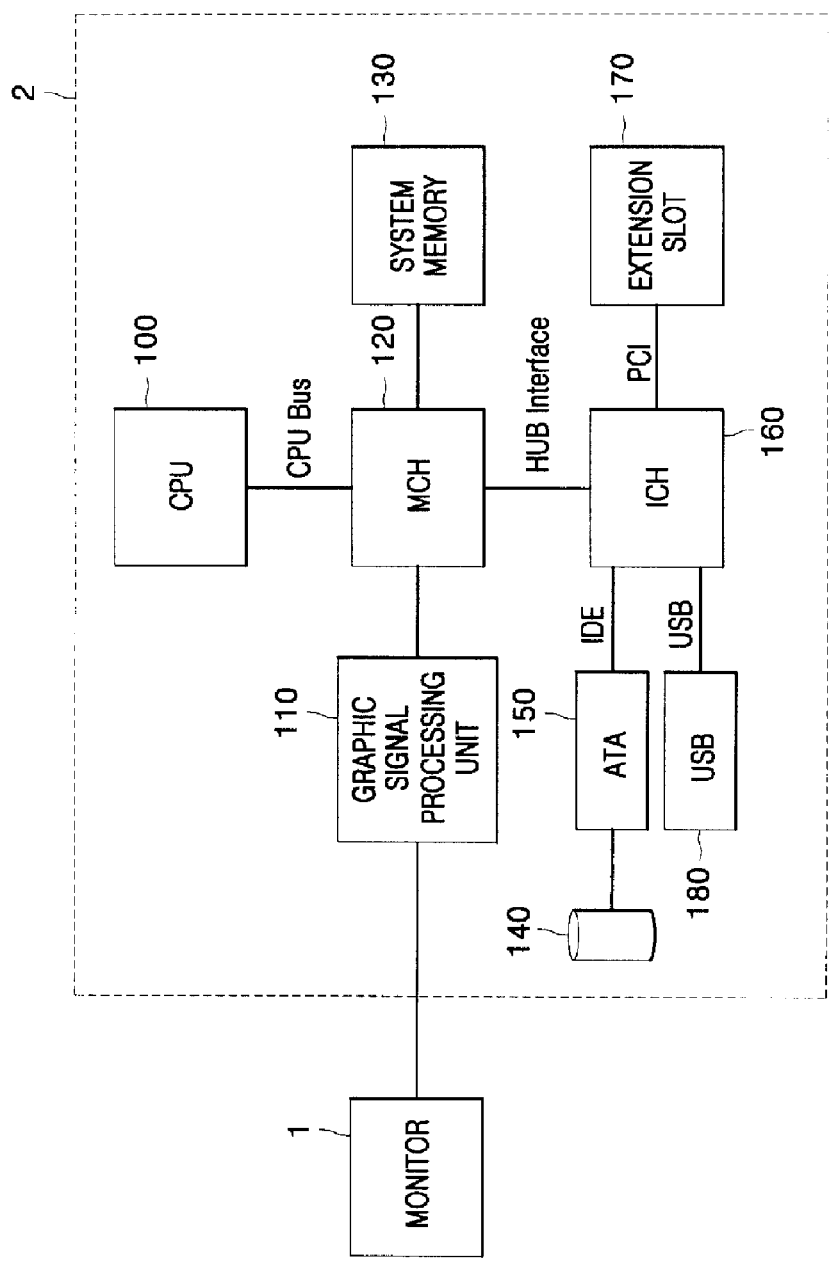
FIG. 1 is a general block view of a computing system.

FIG. 1 is a general block view of a computing system, which is constituted by a monitor 1 and a main body 2, and the main body 2 has a central processing unit (CPU) or a processor 100, a graphic signal processing unit 110, a memory controller hub (MCH) 120, a system memory 130, a hard disk 140, an input and output controller hub (ICH) 160, extension slots 170, an advanced technology attachment (ATA) 150, and a universal serial bus (USB).

Referring to FIG. 1, the computer performs operations in response to requests of a user may be applied to the computing system, and there are, for example, a computer (workstation) and a micro-processor employed in an embedded system, etc.

Each block component of the main body 2 shown in FIG. 1 is described as follows.

The CPU 100 performs an application program and a whole control.

The graphic signal processing device 110 processes the graphic signals transmitted from the system memory 130 to display them on the monitor 1.

The MCH 120 has a host interface connected to the CPU 100, a memory interface connected to the system memory 130, and an accelerated graphics port (AGP) interface connected to an AGP bus for controlling the graphic signal processing device 110, and interfaces with the CPU 100, system memory 130, and the graphic signal processing device 110.

The system memory 130 serves as a storage for allowing a running application program and data being used to be resided so as to have the CPU 100 operate at a faster speed.

Various application programs and various data is stored in the hard disk 140.

The ATA 150 performs interfacing operations between the MCH 120 and the hard disk 140, and the USB 180 is a kind of serial port and is a plug and play interface between the computing system 2 and peripheral devices such as audio player, joystick, keyboard, phone, scanner, printer and so forth.

The ICH 160 controls power supply for peripheral devices such as extension slots, ATA, USB, and so forth while controls the data flow and performs interface operations between the MCH 120 and the extension slots, ATA, and USB.

The extension slots 170 are peripheral component interconnect (PCI) slots wherein a PCI device such as a local area network (LAN) card, a fax modem card or the like is mounted, and they are connected to PCI buses to allow data to be transceived.

Figure 2:
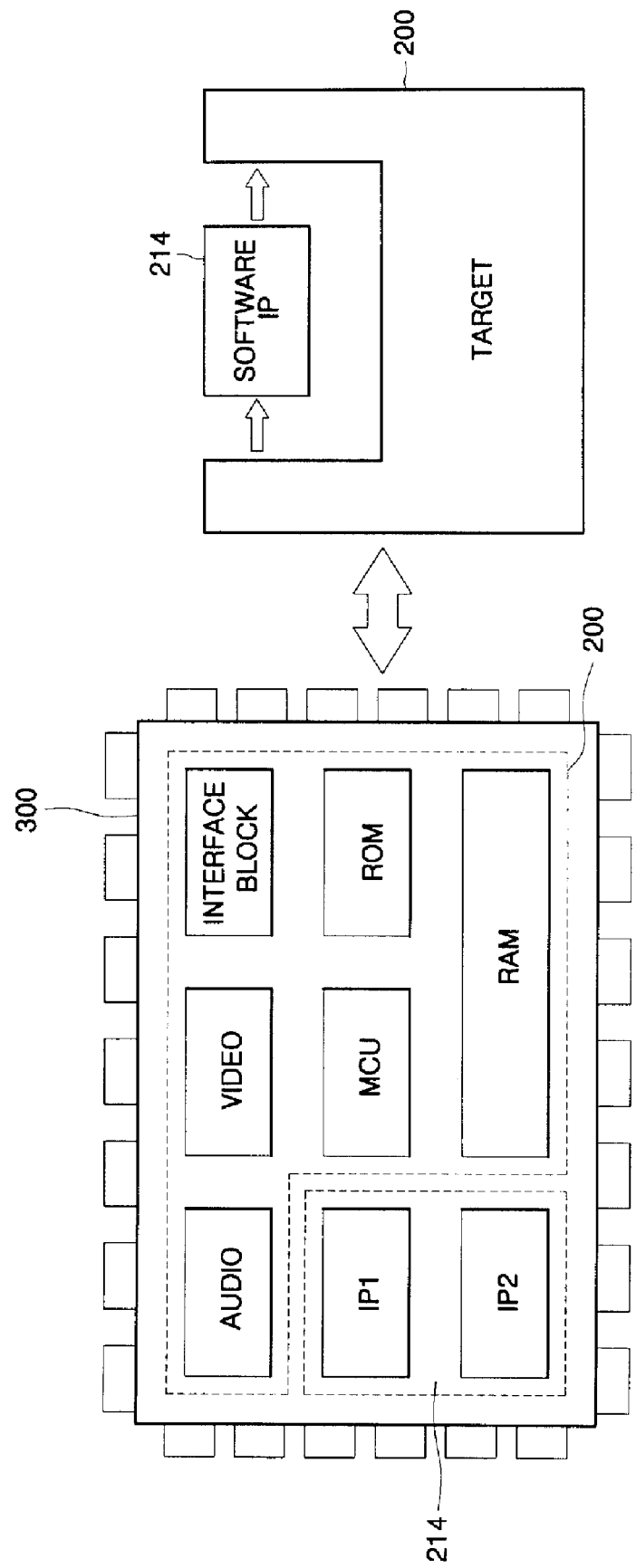
FIG. 2 is a general concept view of a chip having a software IP and a target.

FIG. 2 is a general concept view of a chip having a software IP and a target.

The chip 300 to be fabricated in response to requirements of a customizer is constituted by a plurality of hardware design blocks and hardware IP blocks corresponding to the software IP design block as shown in FIG. 2.

That is, the block 214 shown as IP1 and IP2 is replaced with the hardware IP block when the design verification for the chip 300 is terminated, and is replaced with the software IP design block corresponding to the hardware IP block in the design verification stage, and resides within one region of the system memory 130 of the computing system 2 as a model of software IP 214.

On the contrary, audio, video, interface block, and MCU block may be implemented as FPGA and discrete elements corresponding to the hardware design blocks, and the memory may be implemented as ROM and RAM. However, these components may be variously implemented in response to needs of users or operators.

The hardware design blocks of the chip 300 such as audio, video, interface block, MCU and so forth are collectively referred to as a target 200 in the present invention.

The chip having the above-described configuration allows the organic connection between the target 200 and the software IP 214 as shown in the same Figure so that operation required by the users may be carried out.

Figure 3:
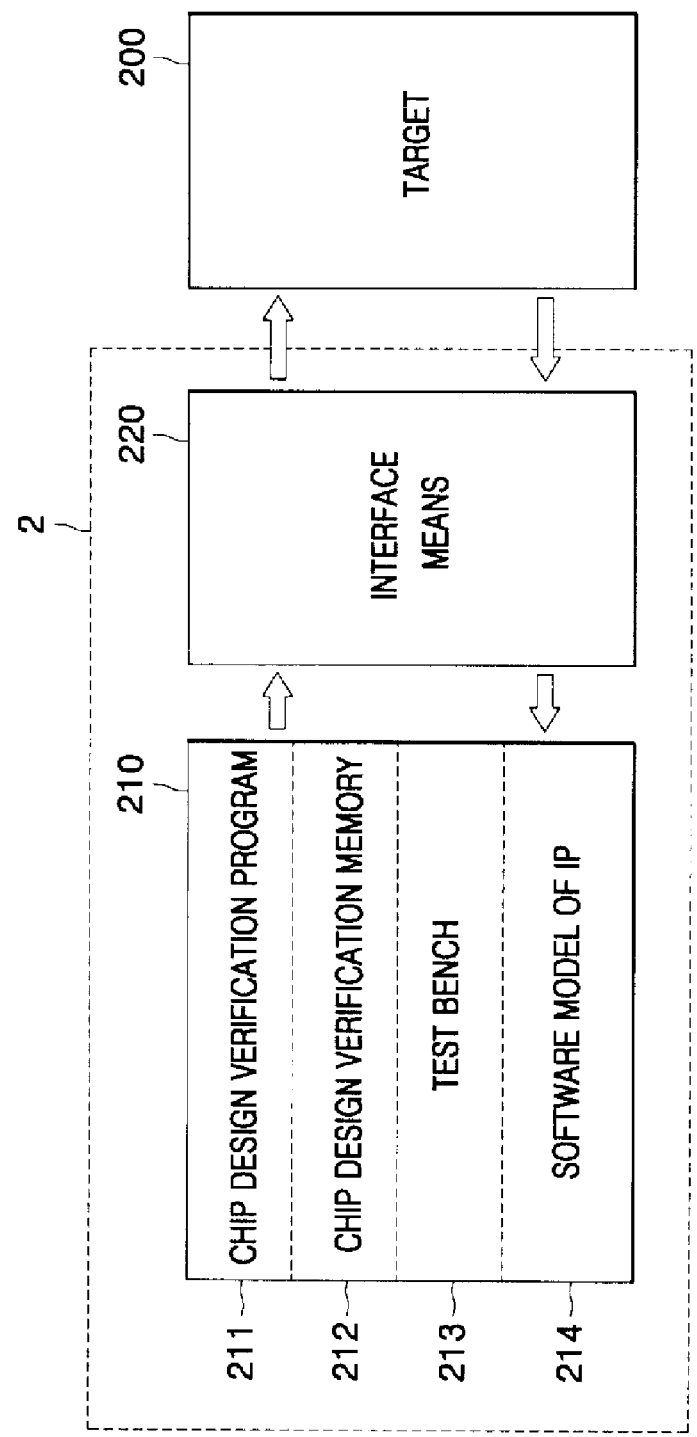
FIG. 3 is a block view of a chip design verification apparatus of the present invention.

FIG. 3 is a block view illustrating a configuration of a chip design verification apparatus in accordance with an embodiment of the present invention, wherein the apparatus has a main body 2 of a computing system for performing the chip design verification, and a target 200 connected to the main body.

The computing system 2 includes a memory block having a chip design verification program 211, a chip design verification memory 212 resided on a system memory 130, a testbench 213 and a software IP 214, an interface means 220, and a CPU (not shown) for performing and controlling the chip design verification program 211.

The target 200 is a hardware design block of a chip which has been described above, and is connected to the main body of the computing system 2 via the interface means 220.

The CPU (not shown) performs the chip design verification program 211 to display menu items and operation results of the chip design verification in a graphic user interface (GUI) manner which allow users to select setting operations necessary for the chip design verification.

In addition, it controls the chip design verification program 211 transfers output data of the software IP 214 to the interface means 220, determines whether the output data of the target 200 received via the interface means 220 is valid, and applies only the valid output data of the target to the software IP 214.

The chip design verification memory 212 has an IP input register IPREG1, an IP output register IPREG2, an IP input memory IPMEM1, and an IP output memory IPMEM2, and stores and updates various input and output data generated at the time of chip design verification operation and data necessary for the chip design verification operation. In addition, it stores multi clock setting values.

The multi clock setting values include an initial position designation value and a period, a high level occupation time and one period occupation time value, which are values converted to the system clock count values of the interface means 220.

The test-bench 213 generates test patterns necessary for the chip design verification, and multi clocks having clock patterns.

The software IP 214 performs the operation by means of data communication with the target 200.

The interface means 220 is installed at the extension slot 170 of the computing system 2 to allow connection with the target 200 outside the computing system 2 to be implemented, and transfers output data of the target 200 to the chip design verification program 211, and determines whether the output data of the software IP 214 which is input via the chip design verification program 211 is valid, and then applies only the valid output data of the software IP 214 to the target 200.

Figure 4:
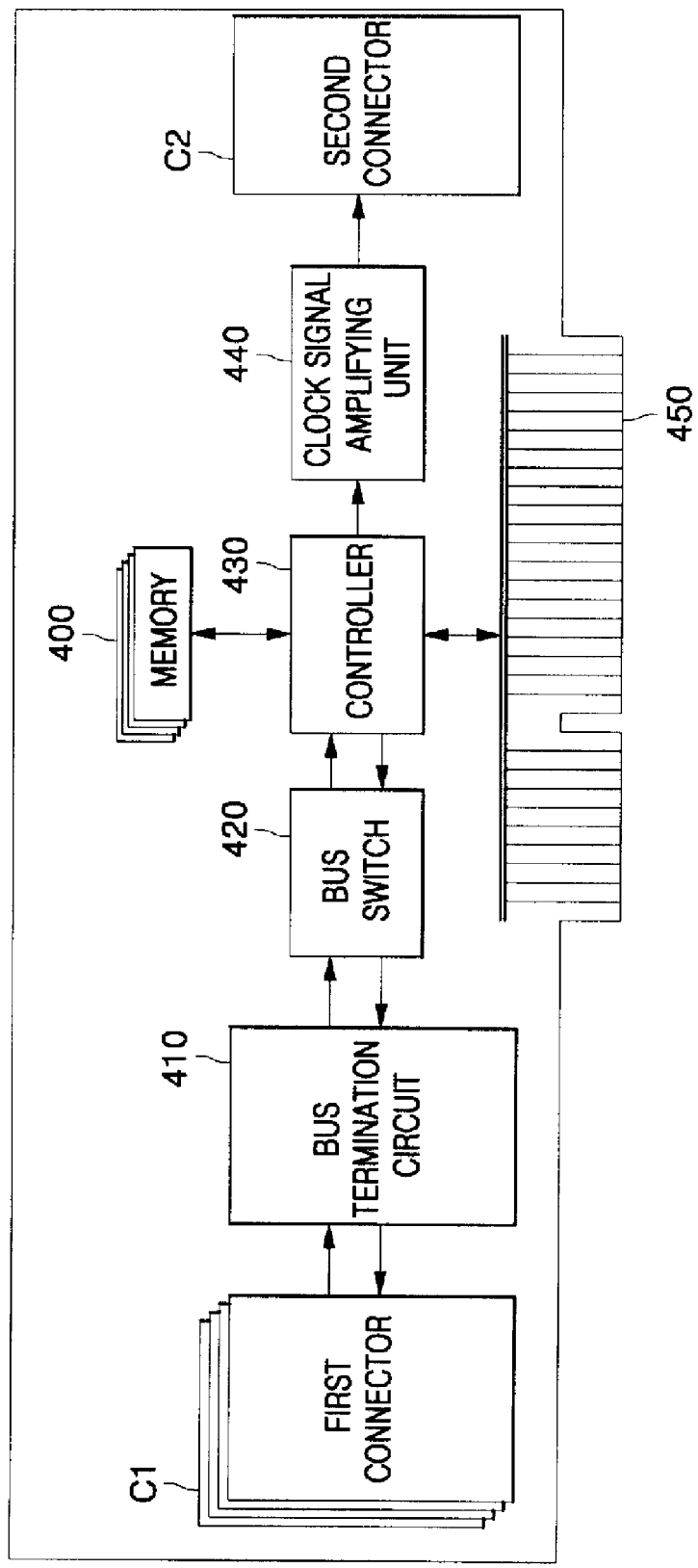
FIG. 4 is a block view of an interface means in accordance with an embodiment of the present invention.

FIG. 4 is a view illustrating a configuration of the interface means according to the embodiment of the present invention, wherein the interface means 220 has a memory 400, a bus termination circuit 410, a bus switch 420, a controller 430, a clock signal amplifying unit 440, connectors C1 and C2 as shown in the same Figure.

The above-described interface means 220 shows the configuration of the interface board, which is mounted in the extension slot 170 of the computing system 2 shown in FIG. 1.

Each function of the blocks shown in FIG. 4 is described as follows.

The memory 400 has a target input register M1, a target output register M2, a target input memory M3, and a target output memory M4, and stores and updates various input and output data generated at the time of chip design verification operation and data necessary for the chip design verification operation in these registers and the memories.

Row sizes of the target output register M2 region and the target input register M1 are determined corresponding to the number of input and output signals connected to the target 200 via the first connector C1, and sizes of the target output memory M4 and the target input memory M3 are determined corresponding to the input and output data capacity between the software IP 214 and the target 200 which are transferred via the PCI bus 450.

The bus termination circuit 410 determines the signal connection states between the target 200 and the interface means 220, and interfaces levels of signals transceived between the target 200 and the interface means 220.

The bus switch 420 performs signal interconnection between the controller 430 and the target 200. In most cases, data to be transmitted to the target 200, that is, the input data of the target, and data to be transmitted from the target 200, that is, the output data of the target co-exist in the data input to the interface means 220. Accordingly, the bus switch 420 performs switching by discriminating the input data of the target from the output data of the target so as to have the input data of the target correspond to the target input memory and the output data of the target correspond to the target output memory.

The controller 430 controls data transmission between the system memory 130 and the memory 400, between the memory 400 and the target 200, between the target 200 and the memory 400, and between the memory 400 and the system memory 130, and generates multi clocks for operating the target 200 and provides them to the target 200.

The clock signal amplifying unit 440 amplifies the multi clocks generated via the controller 430 to operation signal levels for the target 200 and provides them to the target 200.

The first connector C1 is a connector for physical connection between the interface means 220 and the target 200, wherein it is connected to the target by means of an external target connecting cable, and performs data transmission between the target 200 and the interface means 220 after performing pin to signal designation corresponding to signals by means of GUI.

The second connector C2 performs connection with the target 200, and provides the multi clocks generated via the controller 430 to the target 200.

Figure 5:
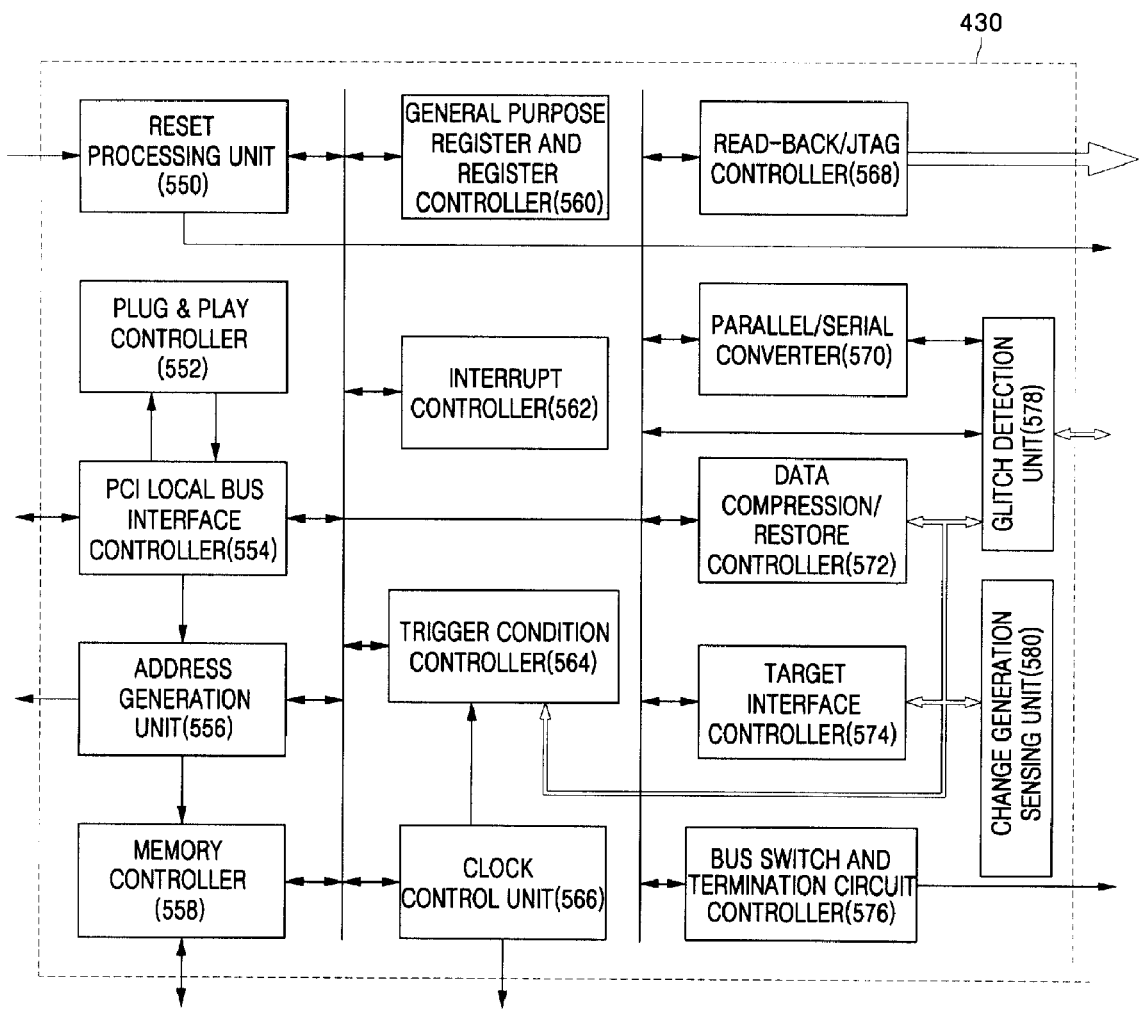
FIG. 5 is a block view of an embodiment of a controller shown in FIG. 4.

FIG. 5 is a block view of an embodiment of the controller shown in FIG. 4, and the controller 430 has a reset processing unit 550, a plug & play controller 552, a PCI local bus interface controller 554, an address generation unit 556, a memory controller 558, a general purpose register and general purpose register controller 560, an interrupt controller 562, a trigger condition controller 564, a clock control unit 566, a readback/JTAG controller 568, a parallel/serial converter 570, a data compression/restore controller 572, a target interface controller 574, a bus switch and termination circuit controller 576, a glitch detection unit 578, and a change generation sensing unit 580.

Each function of the blocks shown in FIG. 5 is described as follows.

The reset processing unit 550 processes signals which are used for performing initialization operations for internal registers of the controller 430 of the interface means 220. The reset signal is forcibly reset by an external reset switch, reset by the chip design verification program 211, reset by the PCI bus system, or generated at the time of completion of the last frame transmission resulting from normal operation completion.

The plug & play controller 552 performs control on various PCI configuration registers (not shown) for the plug & play operation.

The PCI local bus interface controller 554 is directly connected to various signals associated with the PCI, and performs interface control between the system memory 130 and the memory 400 of the interface means 200 using the PCI bus.

The address generation unit 556 generates addresses for the memory 400 of the interface means 220 at the time of data transmission between the memory 400 of the interface means 220 and the target 200 or at the time of data transmission between the system memory 130 of the computing system 2 and the memory 400 of the interface means 220.

The memory controller 558 directly accesses the memory 400 of the interface means 220 to perform data transmission in response to the control signals of the target interface controller 574 and the PCI local bus interface controller 554.

The general purpose register and general purpose register controller 560 check various states of the interface means 220 in response to the data transmission, and stores the results in the internal general purpose register 560. In addition, it stores multi clock setting values.

The interrupt controller 564 controls interrupt generation for requesting data transmission between the memory 400 of the interface means 220 and the system memory 130 of the computing system 2.

The trigger condition controller 564 operates at a high sampling frequency for implementing the operation of the high speed logic analyzer, and the user detects a position meeting the trigger condition while monitoring input and output signals for the target 200 in real time by means of various GUIs displayed on a screen resulted from the operation of the chip design verification means 210 in the state that any trigger conditions set for I/Os which are input/output via the data compression/restore controller 572 are already transferred.

Alternatively, the trigger condition controller 564 may set the number of clock steps or the number of input or output frame steps which are set by the user using the GUI as the trigger condition. When the number of the input or output frame steps is set as the trigger condition in the trigger condition controller 564, the trigger operation is performed at the time that the number of input or output frames counted during the input and output processing procedure of the data compression/restore controller 572 matches the number of the input or output frame steps set as the trigger condition. Similarly, when the number of clock steps is set as the trigger condition, the trigger operation is performed at the time that the counted result of the clock signal which is set as the trigger condition among clock signals generated from the clock controller 566 matches the number of clock steps set as the trigger condition. The trigger condition may be separately applied as described above or may be applied with a priority being mixed. When the trigger position is detected by the above-described method, the trigger condition controller 564 stores information about the end address and the memory region of the end address, and the start address and the memory region of the start address for screen display from information of address and memory at the trigger region input from the memory controller 558 and the address generation unit 556 in consideration of the display reference position on the GUI set by the user, and delivers an interrupt request signal of notifying data transmission corresponding to the memory section for the display to the interrupt controller 562. In addition, it generates the reference signal for the memory controller 558 and the address generation unit 556 in consideration of the display position on the GUI designated by the user.

The clock controller 566 has at least one phase locked loop (PLL) for multiplying the speed of system clock of the interface means 220, and selects the speed of system clock in response to selection of the user.

When the interface means has a plurality of PLLs, the user may select the output frequency of the PLL of each phase, and the interface means 220 sets the output frequency of the PLL of the selected phase as the system clock.

In addition, it obtains the multi clock setting value stored in the general purpose register 560, and generates the multi clocks to the target 200 using the system clock count value selected by the user as a reference.

The read-back/JTAG controller 568 reads out values about registers or any internal nodes of FPGA, MCU, and other element supporting the read-back/JTAG which constitute the target 200. Details about the JTAG comply with IEEE 1149.1 standard. It receives position information of registers or internal nodes of elements to be applied for the read-back/JTAG set by the user, information such as the number of clock steps for performing continuous operations and so forth using menu items associated with the read-back/JTAG of the GUI, and controls generation and store for the read-back/JTAG input and output signals of the corresponding elements which constitute the target 200 based on the information.

The parallel/serial converter 570 converts serial data to parallel data or vice versa.

The data compression/restore controller 572 performs restoring operations when data stored in a compressed format in the memory 400 of the interface means 220 is applied to the target 200, and performs compressing operations when data applied from the target 200 are stored. Changed values of the output end of the target 200 detected by the change generation sensing unit 580 using the user designation or the method of calculating data transfer rate on the GUI, may not be wholly compressed but only the position values of the changed portions and changed values may be extracted and then compressed, which may be transferred to the target interface controller 574.

The target interface controller 574 determines whether output data is valid when it receives the output data of the software IP 214 by means of the performed chip verification program 211, and applies only valid output data to the target 200.

In addition, when the target interface controller 574 is notified of the change generation of values of the output end of the target 200 via the change generation sensing unit 580, it extracts only the changed output values of the target and transfers them to the computing system 2 as output data.

The bus switch and termination circuit controller 576 receives the results of pin to signal designation of the chip design verification program 211 to perform control on the connecting operation for the target 200, and keeps bus termination circuit 410 electrically isolated when a tri-state is designated in various GUI so that the data is not transferred between the connector C1 and the bus termination circuit 410.

The glitch detection unit 578 detects glitch components included in the data incoming from the target 200, and stores the address of the memory 400 of the interface means 220 or the number of clocks at the detected position of the glitch in a separate register (not shown) or the memory 400 so as to display the position of the glitch component on the monitor 1.

The change generation sensing unit 580 continuously senses changes of values of the output end of the target 200 in response to the system clock, and notifies the data compression/restore controller 572 and the target interface controller 574 of the value changes of the output end of the target 200.

FIG. 6 is a flow chart for explaining a data communication method with computing system operations in accordance with an embodiment of the present invention.

The user runs the chip design verification program 211. The CPU 100 in turn has the chip design verification program 211 stored in the hard disk 140 resided on the system memory 130, and has the GUI of the chip design verification program 211 on the monitor 1 via the graphic processing unit 110 (step 110).

The user uses displayed menu items on the GUI of the chip design verification program 211 to designate initialization setting for variables, user designated variables, and associated variables (step 120).

At step 120, the user determines the memory region of the system memory 130 of the computing system 2, the size of the register region, the memory region of the memory 400 of the interface means 220, and the size of the register.

In addition, the user sets identification information of the interface means 220, information whether the PCI bus is occupied, signal transfer directions between the system memory 130 and the interface means 220, memories to be accessed, interrupts for transfer request, interrupts for transfer completion, reset information, and so forth.

The software IP 214 and/or the test-bench 213 for performing the chip design verification using the menu items on the GUI are selected so that the software IP 214 and/or the test-bench 213 resides in the system memory 130 (step 130).

Hereinafter, components of the software block represented as test-bench 213 and/or software IP 214 are collectively referred to as "software IP" for simplicity of description except that the interoperation between the components and the target 200 needs to be correctly described.

A signal-pin mapping window is opened on the GUI, and input and output signals of the selected software IP 214 have mapping relationship with the corresponding input and output pins on the target 200 (step 140).

Multi clock and system clock for chip design verification of the target 200 and the software IP 214 are set using the menu items on the GUI (step 150).

A detailed description of the step 150 will be given below.

The power of the target 200 using the selected software IP 214 becomes turned on (step 160), and the state of the bus termination circuit 410 of the interface means 220 is set as a connection state using the menu item on the GUI (step 170).

An operation start is given to the target 200 using a separate external input device (not shown) or the menu item on the GUI (step 180).

At the step 180, the user may set the operation mode of the target 200 using the menu item on the GUI.

The operation mode of the target 200 includes a limited operation mode in which the operation is run only for the run-time set by the user, and a limitless operation mode continuously carried out until the user requests the operation stop of the target 200 using the separate external input device (not shown) or the menu item on the GUI.

When the target 200 including the software IP 214 receives the initialization operation request from the test-bench 213 or the separate external input device (not shown) or the menu item on the GUI, the chip design verification program 211 transfers the initialization signal of the target to the interface means 220 (step 190).

Figure 7A:
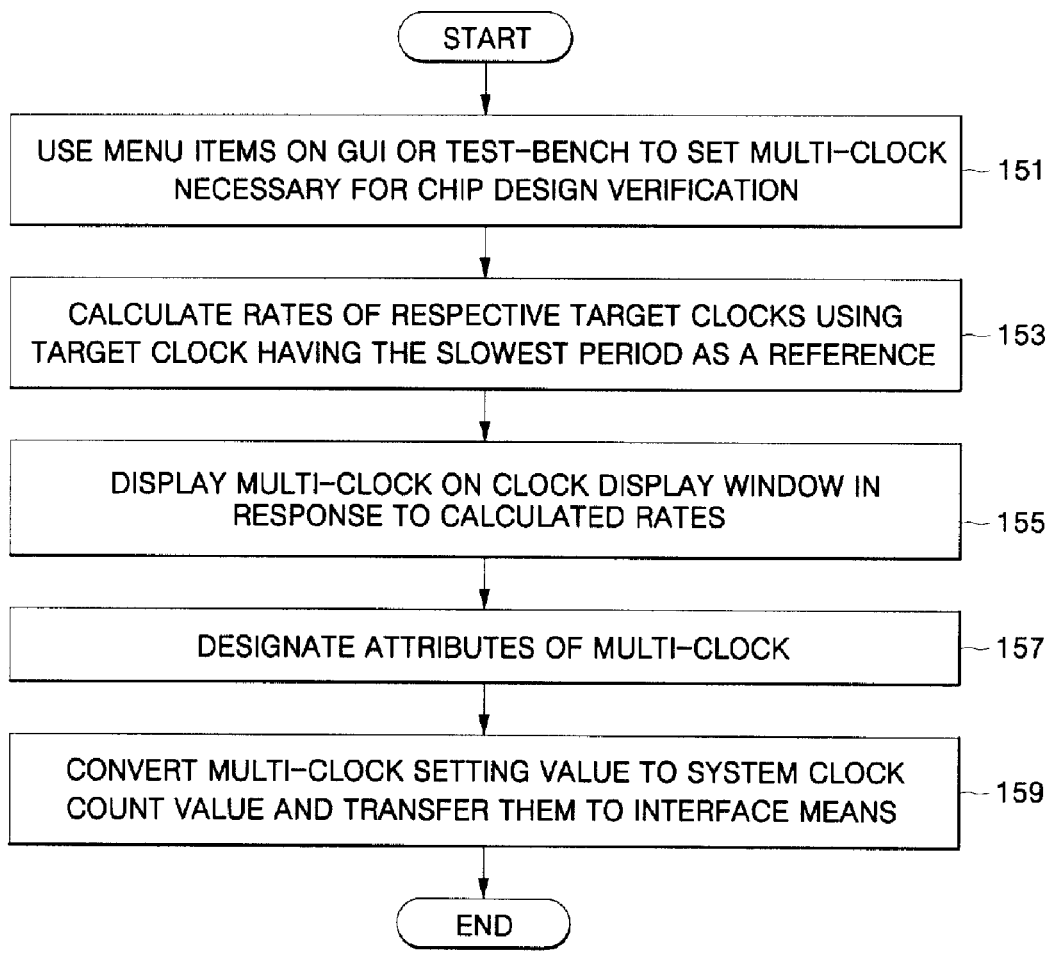

FIG. 7A is a flow chart for explaining a procedure of generating multi clocks and a system clock of FIG. 6 in detail, and FIG. 7B is a diagram illustrating the multi clocks and the system clock of FIG. 7A.

The multi clocks include at least one clock applied for the operation of the target 20 and the software IP 214.

The target 200 and the software IP 214 are constituted by a plurality of design blocks (e.g. audio, video, software IP, etc.), and the design blocks receive different clocks having different periods from each other to perform respective operations.

The system clock is one for mutual synchronization between the target 200 connected to the interface means 220 and the software IP 214 positioned inside the computing system 2, and recognizes the run-time of the target 200 and the software IP 214 using the system clock count value as a reference.

The speed of the system clock applied to the software IP 214 is determined by the internal operation speed of the computing system 2, and the speed of the system clock applied to the target 200 is determined by the system clock speed of the interface means 220 selected by the user of the device.

The user first uses the menu items on the GUI or the test-bench 213 to set the multi clocks necessary for the chip design verification (step 151).

At the step 151, when the multi clocks are defined using the menu items on the GUI, the user selects the clocks necessary for operations of the software IP 214 and the target 200 and defines operation speeds of respective selected clocks. As a result, the chip design verification program 211 obtains respective operation speeds and kinds of clocks constituting the multi clocks for the chip design verification.

For example, when target clocks of 66.1 MHz, 47.2 MHZ, and 850 KHz are required by the target 200 and the software IP 214, the user opens the menu items on the GUI to select first to third target clocks, and inputs 850 KHz, 47.2 MHz, and 66.1 MHz to the first to third target clock values, respectively to set the multi clocks.

In this case, value and unit of respective clock do not mean an absolute clock value, and rates between respective clocks mean relative clock values.

In addition, at the step 151, when the multi clocks are defined using the test-bench 213, the chip design verification program 211 searches clock defined portion of the test-bench 213 to obtain operation speeds of respective clocks and kinds of clocks constituting the multi clocks for the chip design verification.

The chip design verification program 211 obtains the clock defined portion from the clock generation block, and then releases connection between the test case generation block and the clock generation block, and connects the chip design verification program 211 to the test case generation block. The test case generation block then performs the corresponding operation in response to the multi clocks of the chip design verification program 211.

At a step 153, the chip design verification program 211 sets the target clock having the lowest period (i.e. first target clock) as a reference among target clocks obtained from the test-bench 213 or set by the user, and calculates the rates of periods of the rest target clocks (i.e. from the second target clock to $n^{th}$ target clock) (step 153).

The clock display window of the chip design verification program 211 is first displayed on the monitor 1 as shown in (a) of FIG. 7B, one period clock of the target clock (i.e. the first target clock) set as the reference is displayed on the clock display window, and other target clocks (the second target clock to $n^{th}$ target clock) are displayed according to the calculated rates, respectively (step 155) based on the reference target clock.

The user designates attributes of target clocks such as clock duties (D1, D2, Dn) and initial positions (P1, P2, Pn) between clocks with respect to the target clocks displayed using the menu items on the GUI (step 157).

Initial position (P1, P2, Pn) values and periods of respective target clocks, and high level occupation period and one period occupation period are converted to system clock count values so that the multi clock setting values are obtained, which are transferred to the interface means 220 (step 159).

At the step 159, the user selects the speed of the system clock of the interface means 220, and displays the system clock having a speed corresponding to the selected speed on the clock display window of the chip design verification program 211 as shown in (b) of FIG. 7B.

The chip design verification program 211 converts initial position (P1, P2, Pn) values and periods of respective target clocks constituting the multi clocks, high level occupation period and one period occupation period to system clock count values to obtain the multi clock setting value, and stores them in the general purpose register 560 of the controller 430 of the interface means 220 and the chip design verification memory 212 of the system memory 130 of the computing system 2.

When the actual chip design verification operation is carried out, the chip design verification program 211 generates the multi clocks for operating respective functional blocks of the software IP 214 to be applied to the software IP 214 based on the system clock of the computing system 2 and the multi clock setting value stored in the chip design verification memory 212.

In addition, the clock controller 566 of the controller 430 of the interface means 220 generates multi clocks for operating respective functional blocks of the target 200 based on the system clock of the interface means 220 corresponding to the speed selected by the user and the multi clock setting values stored in the general purpose register 560.

As such, the interface means 220 generates the multi clocks for independently operating the target 200 and applies them to the target 200 in the present invention.

Accordingly, the data transfer delay due to operation delay of the interface means 200 occurred in the related art, that is, the transfer delay occurred when the multi clocks applied for the target 200 from the test-bench 213 present within the computing system 2 are provided, may be remarkably reduced according to the present invention.

Figure 9A:
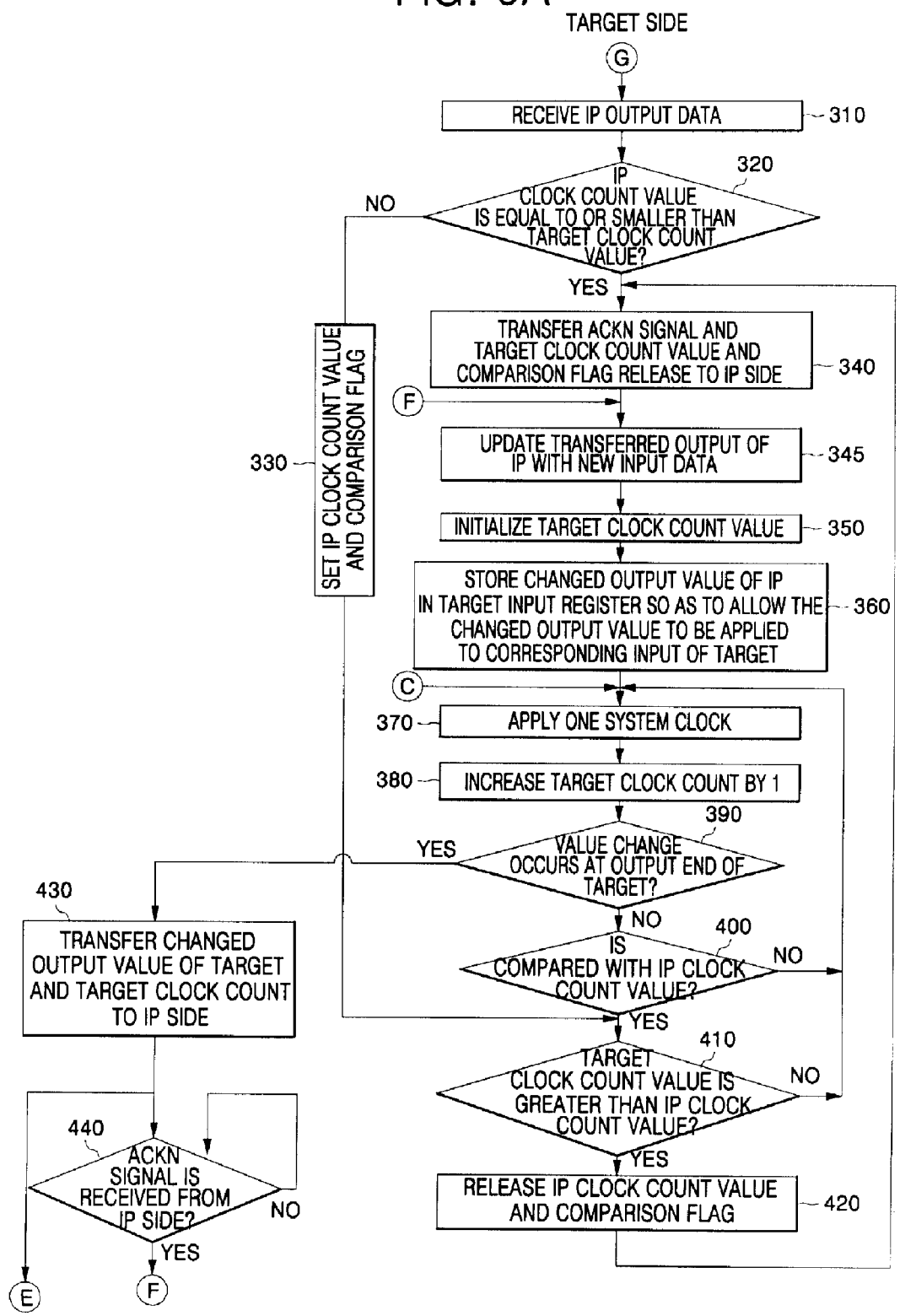
FIGS. 9A and 9B are flow charts for explaining a main operation performed according to a chip design verification method of the present invention.
Figure 9B:
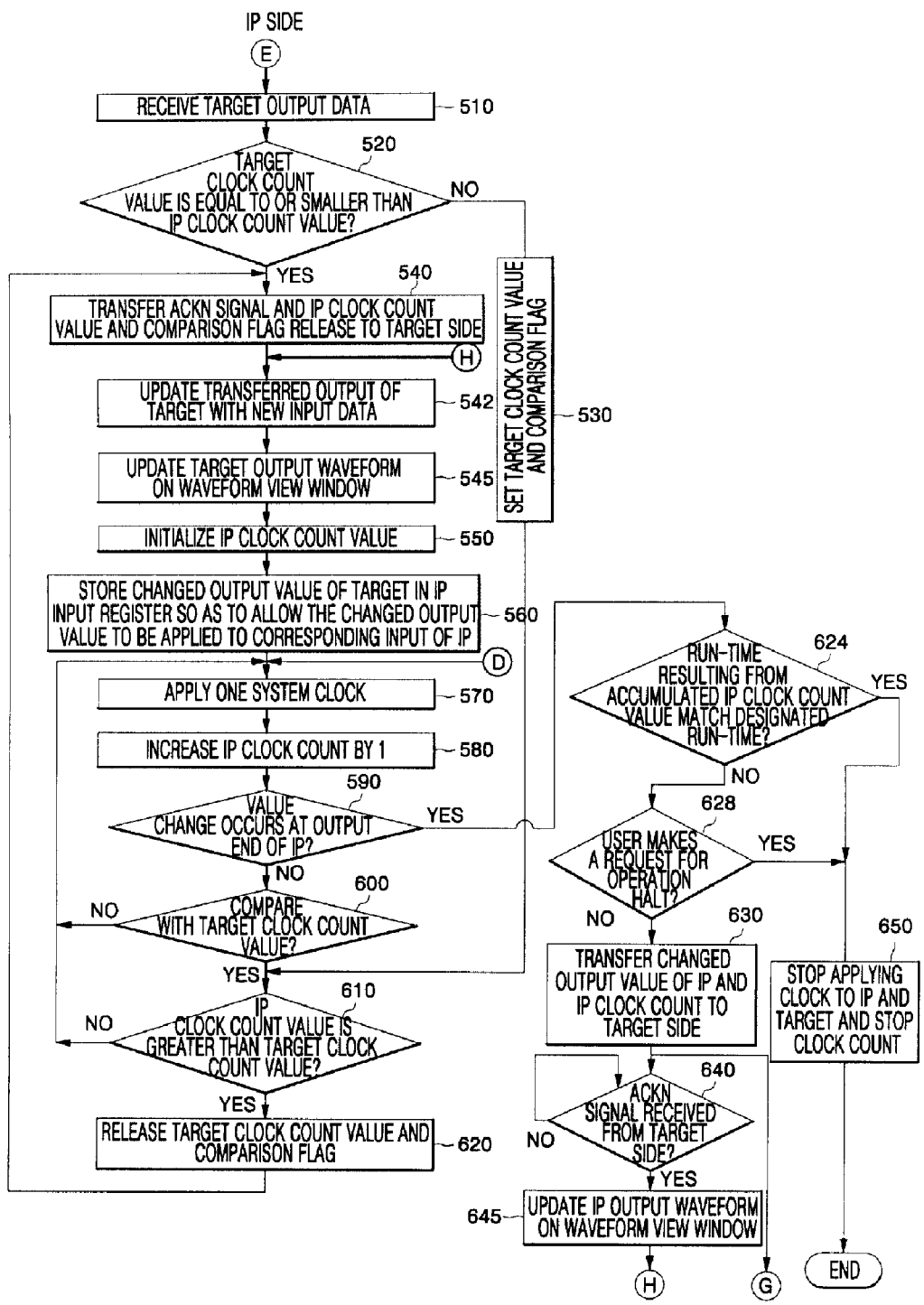

FIGS. 8, 9A and 9B are flow charts for explaining a data communication method in accordance with an embodiment of the present invention, wherein FIG. 8 is a flow chart for explaining an initialization operation of the data communication method according to the embodiment of the present invention, FIG. 9a is a flow chart for explaining a main operation to the target of the interface means (hereinafter, it will be referred to as target side) in the data communication method according to the embodiment of the present invention, and FIG. 9B is a flow chart for explaining a main operation to the software IP of the chip design verification program (hereinafter, it will be referred to as IP side) in the data communication method according to the embodiment of the present invention.

In the data communication method according to the embodiment of the present invention, operation of the IP side and operation of the target side are interworked to perform the initialization operation and the main operation as shown in the Figures.

First, the initialization operation of the data communication method according to the embodiment of the present invention will be described with reference to FIG. 8.

In addition to initiation of the operation of the chip design verification program 211, when the interface means 220 externally receives the initialization input signal, receives the initialization input signal by the setting of the GUI menu items, or receives the initialization input signal output from the test-bench 213 in response to the components of the target of the software block (step 210), the interface means 220 transfers the received initialization input signal to the target side 200.

The target 200 in turn performs the initialization in response to the received initialization signal of the target to generate the initialized output value of the target 200 (step 220).

As the interface means 220 senses the output value generation of the initialized target 200, it generates the initialization signal of the software IP, and sets the "target clock count value" to 0. And the interface means transfers to the IP side output data of the target constituted by the generated initialization signal of the software IP, the "target clock count value" set to 0, and the generated output value of the initialized target 200 (step 230).

At the step 230, in order to transfer the target output data to the IP side, the interface means 220 first compresses the "target output value" via the data compression/restore controller 572 of the controller 430 of the interface means 220, and generates output data constituted by the compressed "target output value" and the "target clock count value".

And the interface means stores the generated output data in a region of the target output memory M4 of the memory 400 of the interface means 220, and generates the transfer request interrupt signal to the IP side via the interrupt controller 562.

The chip design verification program 211 in turn controls the PCI bus interface controller 554 of the controller 430 of the interface means 220 to store the target output data in the IP input memory IPMEM1 of the chip design verification memory 212 of the computing system 2 via the PCI bus 450.

In addition, the interface means 220 is in a standby mode while monitoring whether it receives the output data of the initialized software IP 214 from the IP side, and generates an acknowledge signal (hereinafter, it will be referred to as "ACKN signal") to provide it to the IP side (step 250) when the output data of the software IP 214 are transferred from the IP side (step 240), and recognize that the initialization operation of the target 200 was normally performed and then enters the main operation of the target side (C).

When the chip design verification program 211 receives the initialization signal of the software IP and the output data constituted by the "target output value" and the "target clock count value" of the initialized target 200 of the interface means 220 transferred by the step 230 (step 260), it inputs the initialization signal of the software IP and the received output value of the target 200 to the software IP 214.

At the step 260, in order for the chip design verification program to input the received "target output value" to the software IP 214, it first restores the "target output value" stored in the IP input memory IPMEM1 in a compressed format, and stores the restored "target output value" to the IP input register IPREG1. The "target output value" stored in the IP input register IPREG1 is then applied to an input end of the software IP 214.

The software IP 214 performs initialization in response to the initialization signal of the software IP and the received output value of the initialized target 200 to generate the output value of the initialized software IP 214 (step 270).

The chip design verification program 211 sets the "IP clock count value" to 0, and transfers the "IP clock count value" set to 0 and the initialized "IP output value" to the target side (step 280).

It is then in a standby mode while monitoring whether the "ACKN signal" with respect to the initialized "IP output value" is transferred from the target side, and checks that the initialization operation was normally performed to enter the main operation of the IP side (D) when the "ACKN signal" is received from the target side (step 290).

When the initialization operations for the target 200 and the software IP 214 through the above-described steps are completed, each of the target side and the IP side enters the step of performing the main operation from this point of time.

First, a main operation of the target side will be described with reference to FIG. 9A.

When the initialization operation of the target 200 is normally completed to enter the main operation (C) as described above, the interface means 220 applies one clock of system clocks of the interface means 220 to the target 200 (step 370), and increments the "target clock count value" by 1 (step 380) while monitoring whether the "target output value" is changed using the change generation sensing unit 580 (step 390).

As a result of monitoring at the step 390, when the "target output value" is not changed, a step 400 of checking whether the "IP clock count value and the comparison flag" is set is carried out to return to the step 370.

The interface means 220 repeatedly performs the steps 370 to 400 to wait for entrance from the IP side (G) while monitoring whether the "target output value" is changed.

As a result, when the entrance (G) from the IP side is checked prior to change of the "target output value", that is, when the output data of the software IP 214 transferred from the IP side are received by the interface means 220 (step 310), the controller 430 of the interface means 220 obtains the "IP clock count value", and checks whether the "IP clock count value" transferred from the IP side is equal to or smaller than the currently accumulated "target clock count value" (step 320).

As a result of the check at the step 320, when the "IP clock count value" is equal to or smaller than the "target clock count value", the interface means transfers the "ACKN signal" to the IP side (step 340), and updates the "IP output value" with the input data of the target 200 (step 345).

The "target clock count value" is then initialized (step 350).

In addition, the controller 430 of the interface means 220 restores the compressed "output value of the software IP" via the data compression/restore controller 572 so as to apply the updated input data of the target 200 to the corresponding input of the target 200, and stores the restored value in the target input register M1 (step 360).

And the interface means 220 repeatedly performs the steps 370 to 400 to wait for entrance from the new IP side (G) while monitoring whether the "target output value" is changed.

On the contrary, As a result of the check at the step 320, when the "IP clock count value" is greater than the "target clock count value", an "IP clock count value and comparison flag" is set for comparing the "IP clock count value" with the "target clock count value" (step 330), and processing advances to a step 410 of checking whether the currently accumulated "target clock count value" is greater than the "IP clock count value".

As a result of the step 410, when the "target clock count value" is equal to or smaller than the "IP clock count value", processing repeatedly returns to the steps 370 to 410 while monitoring whether the "target output value" is changed.

When the change of the "target output value" is sensed while the "target clock count value" is smaller than the "IP clock count value", the interface means 220 transfers to the IP side the output data of the target 200 constituted by the changed "target output value" and the accumulated "target clock count value" of the moment (step 430) to perform the entrance to the IP side (E).

The interface means 220 is in a standby mode while monitoring whether the "ACKN signal" with respect to the data transferred from the IP side is received, and immediately performs the entrance (F) to the step 345 when the "ACKN signal" is received from the IP side (step 440).

On the contrary, as a result of the step 410, when the "target output value" is not changed until the "target clock count value" is greater than the "IP clock count value", the interface means 200 releases the "IP clock count value and comparison flag" (step 420), and transfers the "ACKN signal" to the IP side (step 340), and advances to the step 345 of updating the transferred output data of the software IP 214 with new input data.

A main operation of the IP side will be in turn described with reference to FIG. 9B.

As described above, when the initialization operation of the software IP 214 is normally completed to enter the main operation (D), the chip design verification program 211 applies one clock of system clocks to the software IP 214 (step 570), and increments the "IP clock count value" by 1 (step 580) while monitoring whether the "software IP output value" is changed (step 590).

As a result of monitoring at the step 590, when the "software IP output value" is not changed, a step 600 of checking whether the "target clock count value and the comparison flag" is set is carried out to return to the step 570.

The chip design verification program 211 repeatedly performs the steps 570 to 600 to wait for entrance from the target side (E) while monitoring whether the "software IP output value" is changed.

As a result, when the entrance (E) from the target side is checked prior to change of the "software IP output value", that is, when the output data of the target 200 transferred from the target side are received (step 510), the chip design verification program 211 checks whether the "target clock count value" transferred from the target side is equal to or smaller than the currently accumulated "IP clock count value" (step 520).

As a result of the check at the step 520, when the "target clock count value" is equal to or smaller than the "IP clock count value", the chip design verification program transfers the "ACKN signal" to the target side (step 540).

And the chip design verification program 211 updates the "target output value" with the new input data of the software IP 214 (step 542).

The chip design verification program 211 restores the compressed "target output value stored in the IP input memory IPMEM1, and displays the "target output value" on the waveform view window in response to the "target clock count value". That is, it updates the output waveform with respect to the target 200 on the waveform view window (step 545).

The chip design verification program 211 initializes the "IP clock count value" (step 550), and stores the restored "target output value" in the IP input register IPREG1 so as to have the updated input data to be applied to the corresponding input of the software IP 214 (step 560).

And the chip design verification program 211 repeatedly performs the steps 570 to 600 to wait for entrance from the new target side (E) while monitoring whether the "software IP output value" is changed.

On the contrary, As a result of the check at the step 520, when the "target clock count value" is greater than the "IP clock count value", the chip design verification program set the "target clock count value and comparison flag" for comparing the "IP clock count value" and the "target clock count value" (step 530), and processing advances to a step 610 of checking whether the currently accumulated "IP clock count value" is greater than the "target clock count value".

As a result of the step 610, when the "IP clock count value" is equal to or smaller than the "target clock count value", processing repeatedly returns to the steps 570 to 610 while monitoring whether the "software IP output value" is changed.

When the change of the "software IP output value" is sensed while the "IP clock count value" is smaller than the "target clock count value", the chip design verification program 211 checks whether the run-time performed by the accumulated effective "target clock count value" matches the run time set by the user in order to check whether the operation is stopped (step 624).

The chip design verification program senses whether the user has requested the operation halt via the menu item on the GUI or an external input device (not shown) (step 628).

As a result of the steps 624 and 628, when the chip design verification program 211 must be continued, the chip design verification program 211 transfers to the target side the output data of the software IP 214 constituted by the changed "software IP output value" and the accumulated "IP clock count value" of the moment to perform the entrance to the target side (G) (step 630).

The chip design verification program 211 is in a standby mode while monitoring whether the "ACKN signal" with respect to the data transferred from the target side is received, and displays the "software IP output value" changed in response to the accumulated "IP clock count value" on the waveform view window when the "ACKN signal" is transferred from the target side (step 640). That is, it updates the output waveform of the software IP 214 on the waveform view window (step 645), and performs the entrance to the step 542 (H).

On the contrary, as a result of the steps 624 and 628, when the chip design verification operation must be halted, the chip design verification program 211 stops applying system clocks to the software IP 214, stops counting of the IP clock, and controls the interface means 220 to have no system clocks applied the target 200 (step 650).

In addition, as a result of the step 610, when the "IP output value" is not changed until the "IP clock count value" is greater than the "target clock count value", the chip design verification program 211 releases the "target clock count value and comparison flag" (step 620), and transfers the "ACKN signal" to the target side (step 440), and advances to the step 542 of updating the transferred output data of the target 200 with new input data.

Although not described with reference to FIGS. 8, 9A and 9B, it can be clearly understood that the chip design verification program 211 and the interface means 220 may apply system clocks generated by independent operations to the software IP 214 and the target 200, respectively, while generating multi clocks using the system clock count value as a reference to apply them to the software IP 214 and the target 200.

In addition, when output data is transferred from the IP side or the target side to the target side or the IP side in FIGS. 9A and 9B, it is possible to obtain only the changed data and transfer the data in a compressed format in order to reduce the data amount.

Preferred embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

The invention claimed is:

1. A chip design verification apparatus for verifying a target unit including at least one hardware block, the chip design verification apparatus comprising:
   a computer including at least one software block in data communication with the at least one hardware block, and which verifies an operation between the at least one hardware block and the at least one software block, the computer comprising:
   an interface means of transmitting output data of the hardware block, determining whether output data of the software block which comprises a system clock count value of a chip design verification program when the output value of the software block is changed is valid, and applying only valid output data of the software block to the hardware block;
   a storage means of storing the at least one software block and the chip design verification program for verifying the at least one software block; and
   a controller for transmitting the output data of the software block generated by an operation of executing the chip design verification program to the interface means, determining whether the output data of the at least one hardware block input via the interface means is valid, and applying only valid output data of the at least one hardware block to the at least one software block.

2. The chip design verification apparatus according to claim 1, wherein the chip design verification program has a graphic user interface, and allows data transceived by executing the chip design verification program to be displayed via the graphic user interface.

3. The chip design verification apparatus according to claim 1, wherein the chip design verification program obtains a multi clock setting value for operating the software block and the hardware block, and stores the value in the interface means.

4. The chip design verification apparatus according to claim 3, wherein the interface means has a clock controller of generating multi clocks in response to the multi clock setting value and a system clock of the interface means and applying the multi clocks to the hardware block.

5. The chip design verification apparatus according to claim 4, wherein the output data of the hardware block has an output value of the hardware block changed in response to the multi clocks applied from the interface means, and a system clock count value of the interface means when the output value of the hardware block is changed.

6. The chip design verification apparatus according to claim 5, wherein the valid output data of the hardware block is an output value of the hardware block when the system clock count value of the interface means is equal to or smaller than the system clock count value of the chip design verification program, and is an output value of the hardware block when the output value of the software block is not changed even when the system clock count value of the chip design verification program is increased so as to be equal to the system clock count value of the interface means after determination that the system clock count value of the interface means is greater than the system clock count value of the chip design verification program.

7. The chip design verification apparatus according to claim 3, wherein the chip design verification program generates multi clocks in response to the multi clock setting value and the system clock of the chip design verification program to apply the multi clock to the software block.

8. The chip design verification apparatus according to claim 7, wherein output data of the software block further comprises the output value of the software block changed in response to the multi clocks applied from the chip design verification program.

9. The chip design verification apparatus according to claim 8, wherein the valid output data of the software block is an output value of the software block when the system clock count value of the chip design verification program is equal to or smaller than the system clock count value of the interface means, and is an output value of the software block when the output value of the hardware block is not changed even when the system clock count value of the interface means is increased so as to be equal to the system clock value of the chip design verification program after determination that the system clock count value of the chip design verification program is greater than the system clock count value of the interface means.

10. The chip design verification apparatus according to claim 7, wherein the software block has a test-bench, and the test-bench supplies the multi clock setting value to the chip design verification program and operates in response to the multi clocks of the chip design verification program instead of the multi clocks owned by the test-bench itself.

11. A data communication method for a chip design verification apparatus for verifying a target unit including at least one hardware block including a computer, the computer having at least one software block, a chip design verification program, and a storage means of storing input and output data, and an interface means of interfacing with the software block and the hardware block, the method comprising:

a software side operation step of transmitting output data generated by the operation of the software block to the interface means, determining whether the output data of the hardware block which comprises a system clock count value of the chip design verification program when the output value of the software block is changed received via the interface means is valid by executing the chip design verification program, and applying only the valid output data of the hardware block to the software block; and a hardware side operation step of transmitting output data generated by the operation of the hardware block to the software block, determining whether the output data of the software block received is valid by executing the chip design verification program in the interface means, and applying only the valid output data of the software block to the hardware block.

12. The method according to claim 11, further comprising:

a step of allowing the chip design verification program to obtain a multi clock setting value to be provided to the interface means, and generate multi clocks in response to a system clock of the chip design verification program and the multi clock setting value to be applied to the software block; and a step of allowing the interface means to generate multi clocks in response to the system clock of the interface means and the multi clock setting value to be applied to the hardware block.

13. The method according to claim 12, wherein the output data of the hardware block has an output value of the hardware block changed in response to the multi clocks applied from the interface means, and a system clock count value of the interface means when the output value of the hardware block is changed.

14. The method according to claim 13, wherein the valid output data of the hardware block is an output value of the hardware block when the system clock count value of the interface means is equal to or smaller than the system clock count value of the chip design verification program, and is an output value of the hardware block when the output value of the software block is not changed even when the system clock count value of the chip design verification program is increased so as to be equal to the system clock count value of the interface means after determination that the system clock count value of the interface means is greater than the system clock count value of the chip design verification program.

15. The method according to claim 14, wherein output data of the software block has an output value of the software block changed in response to the multi clocks applied from the chip design verification program.

16. The method according to claim 15, wherein the valid output data of the software block is an output value of the software block when the chip design verification program is equal to or smaller than the system clock count value of the interface means, and is an output value of the software block when the output value of the hardware block is not changed even when the system clock count value of the interface means is increased so as to be equal to the system clock value of the chip design verification program after determination that the system clock count value of the chip design verification program is greater than the system clock count value of the interface means.

17. The method according to claim 16, wherein the software side operation step includes:
a step of initiating an operation of receiving output data of the hardware via the interface means by executing the chip design verification program;
a step of confirming that the valid output data of the hardware block is received and inputting the output data to the software block, when the received system clock count value of the interface means is equal to or smaller than the system clock count value of the chip design verification program, or when the output value of the software block is not changed even when the received system clock count value of the interface means is greater than the system clock count value of the chip design verification program to cause the system clock count value of the chip design verification program to be increased so as to be equal to the received system clock count value of the interface means;
a step of transmitting the output data of the software block to the interface means when the output value of the software block is changed before the system clock count value of the chip design verification program is increased so as to be equal to the received system clock count value of the interface means; and
a step of initializing the increased system clock count value of the chip design verification program when the input step or the transmission step is completed, and increasing the system clock count value of the chip design verification program while monitoring whether the output value of the software block is changed.

18. The method according to claim 17, wherein the input step includes:
a step of inputting the received output value of the hardware block to the software block as the valid output data of the hardware block when the received system clock count value of the interface means is equal to or smaller than the system clock count value of the chip design verification program;
a step of increasing the system clock count value of the chip design verification program while confirming whether the output value of the software block is changed when the received system clock count value of the interface means is greater than the system clock count value of the chip design verification program; and
a step of inputting the received output value of the hardware block to the software block as the valid output data of the hardware block when the output value of the software block is not changed until the increased system clock count value of the chip design verification program is greater than the received system clock count value of the interface means.

19. The method according to claim 18, wherein the input step further includes:
a step of displaying the valid output data of the hardware block by executing the chip design verification program.

20. The method according to claim 17, wherein the transmission step includes:
a step of increasing the system clock count value of the chip design verification program while confirming whether the output value of the software block is changed, when the received system clock count value of the interface means is greater than the system clock count value of the chip design verification program; and a step of transmitting the output data of the software block to the interface means when the output value of the software block is changed in the case that the increased system clock count value of the chip design verification program is equal to or smaller than the received system clock count value of the interface means.

21. The method according to claim 20, wherein the transmission step further includes:
a step of displaying the valid output data of the software block by executing the chip design verification program.

22. The method according to claim 16, wherein the hardware side operation step includes:
a step of initiating an operation of receiving output data of the software via the interface means by executing the chip design verification program;
a step of confirming that the valid output data of the software block is received and inputting the output data to the hardware block, when the received system clock count value of the chip design verification program is equal to or smaller than the system clock count value of the interface means, or when the output value of the interface means is not changed even when the received system clock count value of the chip design verification program is greater than the system clock count value of the interface means to cause the system clock count value of the interface means to be increased so as to be equal to the received system clock count value of the chip design verification program;
a step of transmitting the output data of the hardware block to the chip design verification program when the output value of the hardware block is changed before the system clock count value of the interface means is increased so as to be equal to the received system clock count value of the chip design verification program; and
a step of initializing the increased system clock count value of the interface means when the input step or the transmission step is completed, and increasing the system clock count value of the interface means while monitoring whether the output value of the hardware block is changed.

23. The method according to claim 22, wherein the input step includes:
a step of inputting the received output value of the software block to the hardware block as the valid output data of the software block when the received system clock count value of the chip design verification program is equal to or smaller than the system clock count value of the interface means;
a step of increasing the system clock count value of the interface means while confirming whether the output value of the hardware block is changed when the received system clock count value of the chip design verification program is greater than the system clock count value of the interface means; and
a step of inputting the received output value of the software block to the hardware block as the valid output data of the software block when the output value of the hardware block is not changed until the increased system clock count value of the interface means is greater than the received system clock count value of the chip design verification program.

24. The method according to claim 23, wherein the transmission step includes:
a step of increasing the system clock count value of the interface means confirming whether the output value of the hardware block is changed, when the received system clock count value of the chip design verification program is greater than the system clock count value of the interface means; and a step of transmitting the output data of the hardware to the chip design verification program when the output value of the hardware block is changed in the case that the increased system clock count value of the interface means is equal to or smaller than the received system clock count value of the chip design verification program.

25. The method according to claim 12, wherein the software block has a test-bench, and the test-bench supplies the multi clock setting value to the chip design verification program and operates in response to the multi clocks of the chip design verification program instead of the multi clocks owned by the test-bench itself.

26. A data communication method for a chip design verification apparatus for verifying a target unit including a hardware block, including a software block having at least one function block, a chip design verification program for verifying operations of the software block and the hardware block, a storage means of storing input and output data of the software block generated by executing the chip design verification program, and an interface means of performing an interfacing operation between the hardware block and the software block, the method comprising:

a clock generation step of allowing the chip design verification program to obtain a multi clock setting value to be provided to the interface means, and generate multi clocks in response to a system clock of the chip design verification program and the multi clock setting value to be applied to the software block, and allowing the interface means to generate multi clocks in response to the system clock of the interface means and the multi clock setting value to be applied to the hardware block;

a software side operation step of transmitting output data generated by the operation of the software block operating in response to the multi clocks of the chip design verification program to the interface means, determining whether the output data of the hardware block received via the interface means is valid by executing the chip design verification program, and applying only the valid output data of the hardware block to the software block; and a hardware side operation step of transmitting output data generated by the operation of the hardware block operating in response to the multi clocks of the interface means to the software block, determining whether the output data of the software block received is valid by executing the chip design verification program in the interface means, and applying only the valid output data of the software block to the hardware block, wherein the output data of the hardware block has an output value of the hardware block changed in response to the multi clocks applied from the interface means and a system clock count value of the interface means when the output value of the hardware block is changed.

27. The method according to claim 26, wherein the valid output data of the hardware block is an output value of the hardware block when the system clock count value of the interface means is equal to or smaller than the system clock count value of the chip design verification program, and is an output value of the hardware block when the output value of the software block is not changed even when the system clock count value of the interface means is greater than the system clock count value of the chip design verification program to cause the system clock count value of the chip design verification program to be increased so as to be equal to the system clock count value of the interface means.

28. The method according to claim 27, wherein output data of the software block has an output value of the software block changed in response to the multi clocks applied from the chip design verification program, and a system clock count value of the chip design verification program when the output value of the software block is changed.

29. The method according to claim 28, wherein the valid output data of the software block is an output value of the software block when the chip design verification program is equal to or smaller than the system clock count value of the interface means, and is an output value of the software block when the output value of the hardware block is not changed even when the system clock count value of the chip design verification program is greater than the system clock count value of the interface means to cause the system clock count value of the interface means to be increased so as to be equal to the system clock count value of the chip design verification program.

30. The method according to claim 29, wherein the software side operation step includes:

a step of initiating an operation of receiving output data of the hardware via the interface means by executing the chip design verification program;

a step of confirming that the valid output data of the hardware block is received and inputting the output data to the software block, when the received system clock count value of the interface means is equal to or smaller than the system clock count value of the chip design verification program, or when the output value of the software block is not changed even when the received system clock count value of the interface means is greater than the system clock count value of the chip design verification program to cause the system clock count value of the chip design verification program to be increased so as to be equal to the received system clock count value of the interface means;

a step of transmitting the output data of the software block to the interface means when the output value of the software block is changed before the system clock count value of the chip design verification program is increased so as to be equal to the received system clock count value of the interface means; and a step of initializing the increased system clock count value of the chip design verification program when the input step or the transmission step is completed, and increasing the system clock count value of the chip design verification program while monitoring whether the output value of the software block is changed.

31. The method according to claim 30, wherein the input step includes:

a step of inputting the received output value of the hardware block to the software block as the valid output data of the hardware block when the received system clock count value of the interface means is equal to or smaller than the system clock count value of the chip design verification program;

a step of increasing the system clock count value of the chip design verification program while confirming whether the output value of the software block is changed when the received system clock count value of the interface means is greater than the system clock count value of the chip design verification program; and a step of inputting the received output value of the hardware block to the software block as the valid output data of the hardware block when the output value of the software block is not changed until the increased system clock count value of the chip design verification program is greater than the received system clock count value of the interface means.

32. The method according to claim 31, wherein the input step further includes:
a step of displaying the valid output data of the hardware block by executing the chip design verification program.

33. The method according to claim 30, wherein the transmission step includes:
a step of increasing the system clock count value of the chip design verification program while confirming whether the output value of the software block is changed, when the received system clock count value of the interface means is greater than the system clock count value of the chip design verification program; and
a step of transmitting the output data of the software block to the interface means when the output value of the software block is changed in the case that the increased system clock count value of the chip design verification program is equal to or smaller than the received system clock count value of the interface means.

34. The method according to claim 33, wherein the transmission step further includes:
a step of displaying the valid output data of the software block by executing the chip design verification program.

35. The method according to claim 29, wherein the hardware side operation step includes:
a step of initiating an operation of receiving output data of the software block via the interface means by executing the chip design verification program;
a step of confirming that the valid output data of the software block is received and inputting the output data to the hardware block, when the received system clock count value of the chip design verification program is equal to or smaller than the system clock count value of the interface means, or when the output value of the interface means is not changed even when the received system clock count value of the chip design verification program is greater than the system clock count value of the interface means to cause the system clock count value of the interface means to be increased so as to be equal to the received system clock count value of the chip design verification program;
a step of transmitting the output data of the hardware block to the chip design verification program when the output value of the hardware block is changed before the system clock count value of the interface means is increased so as to be equal to the received system clock count value of the chip design verification program; and
a step of initializing the increased system clock count value of the interface means when the input step or the transmission step is completed, and increasing the system clock count value of the interface means while monitoring whether the output value of the hardware block is changed.

36. The method according to claim 35, wherein the input step includes:
a step of inputting the received output value of the software block to the hardware block as the valid output data of the software block when the received system clock count value of the chip design verification program is equal to or smaller than the system clock count value of the interface means;
a step of increasing the system clock count value of the interface means while confirming whether the output value of the hardware block is changed when the received system clock count value of the chip design verification program is greater than the system clock count value of the interface means; and
a step of inputting the received output value of the software block to the hardware block as the valid output data of the software block when the output value of the hardware block is not changed until the increased system clock count value of the interface means is greater than the received system clock count value of the chip design verification program.

37. The method according to claim 35, wherein the transmission step includes:
a step of increasing the system clock count value of the chip design verification program while confirming whether the output value of the hardware block is changed, when the received system clock count value of the chip design verification program is greater than the system clock count value of the interface means; and
a step of transmitting the output data of the hardware to the chip design verification program when the output value of the hardware block is changed in the case that the increased system clock count value of the interface means is equal to or smaller than the received system clock count value of the chip design verification program.

38. The method according to claim 26, wherein the software block has a test-bench, and the test-bench supplies the multi clock setting value to the chip design verification program and operates in response to the multi clocks of the chip design verification program instead of the multi clocks owned by the test-bench itself.

* * * * *